(12) United States Patent
Chen

(10) Patent No.: US 6,390,188 B1
(45) Date of Patent: May 21, 2002

(54) CPU HEAT EXCHANGER

(76) Inventor: Chung-Ping Chen, P.O. Box 7-820, Taipei (TW)

( * ) Notice: Subject to any disclaimer, the term of this patent is extended or adjusted under 35 U.S.C. 154(b) by 0 days.

(21) Appl. No.: 09/742,637

(22) Filed: Dec. 22, 2000

(51) Int. Cl.[7] .................................. H05K 7/20
(52) U.S. Cl. .................. 165/185; 165/80.3; 174/16.3; 257/722; 361/704; 361/697
(58) Field of Search ................. 165/80.3, 185, 165/109.1, 152; 174/16.3; 257/722; 361/704, 697

(56) References Cited

U.S. PATENT DOCUMENTS 5,625,229 A * 4/1997 Kojima et al. .......... 257/722 X
5,701,951 A * 12/1997 Jean ....................... 165/80.3 X
5,706,169 A * 1/1998 Yeh ......................... 361/697 X

* cited by examiner

Primary Examiner—Leonard Leo

(57) ABSTRACT

A CPU heat exchanger comprises a plurality of curved metal thin pieces, each surface of each metal thin piece having punched with a plurality of ribs, the ribs at opposite sides being alternatively arranged; so that a trench is formed between two metal thin pieces for being formed with a turbulent flow; each rib having openings at an upper side and a lower side thereof. Airflow in the trench is turbulent and thus, air therein can absorb much heat. The openings on the upper and lower sides of each ribs cause air therein to expand and thus the heat can be absorbed more quickly. Therefore, cool and hot air are exchanged quickly.

1 Claim, 5 Drawing Sheets

PRIOR ART

CPU HEAT EXCHANGER

BACKGROUND OF THE INVENTION

1. Field of the Invention

The present invention relates to a CPU heat exchanger comprising a plurality of curved metal thin pieces and a plurality of ribs are alternatively arranged on the pieces so that a larger area is provided for speeding the heat exchange of a CPU.

2. Description of the Prior Art

CPU is a primary component in a computer. However, the speed of the CPU is increased quickly, while the heat dissipated from a CPU is increased with the speed increment. A higher temperature in the CPU will destroy the CPU, and further, some components adjacent to the CPU are also possible destroyed due to the heat dissipated from the CPU. Therefore, heat from the CPU must be dissipated quickly. In the prior art, the heat-dissipating device of a CPU is primarily a fan and aluminum extruding fins for absorbing heat of a CPU. However, the fins have predetermined width and thus, a large space is required. Therefore, the heat dissipating capacity is low. Therefore, this conventional design is not suitable in the current requirement.

SUMMARY OF THE INVENTION

Accordingly, the primary object of the present invention is to provide a CPU heat exchanger. The CPU heat exchanger comprises a plurality of curved metal thin pieces so that a larger area is provided for speeding the heat exchange.

Another object of the present invention is to provide a CPU heat exchanger, wherein each surface of each metal thin piece having punched with a plurality of ribs. The ribs at opposite sides are alternatively arranged, so that a trench is formed between two metal thin pieces for being formed with a turbulent flow.

A further object of the present invention is to provide a CPU heat exchanger, wherein each rib has openings at an upper side and a lower side thereof. Airflow in the trench is turbulent and thus, air therein can absorb much heat, and the openings on the upper and lower sides of each ribs cause air therein to expand and thus the heat can be absorbed more quickly. Therefore, cool and hot air are exchanged quickly.

The various objects and advantages of the present invention will be more readily understood from the following detailed description when read in conjunction with the appended drawing.

DETAILED DESCRIPTION OF THE PREFERRED EMBODIMENT

Figure 1:
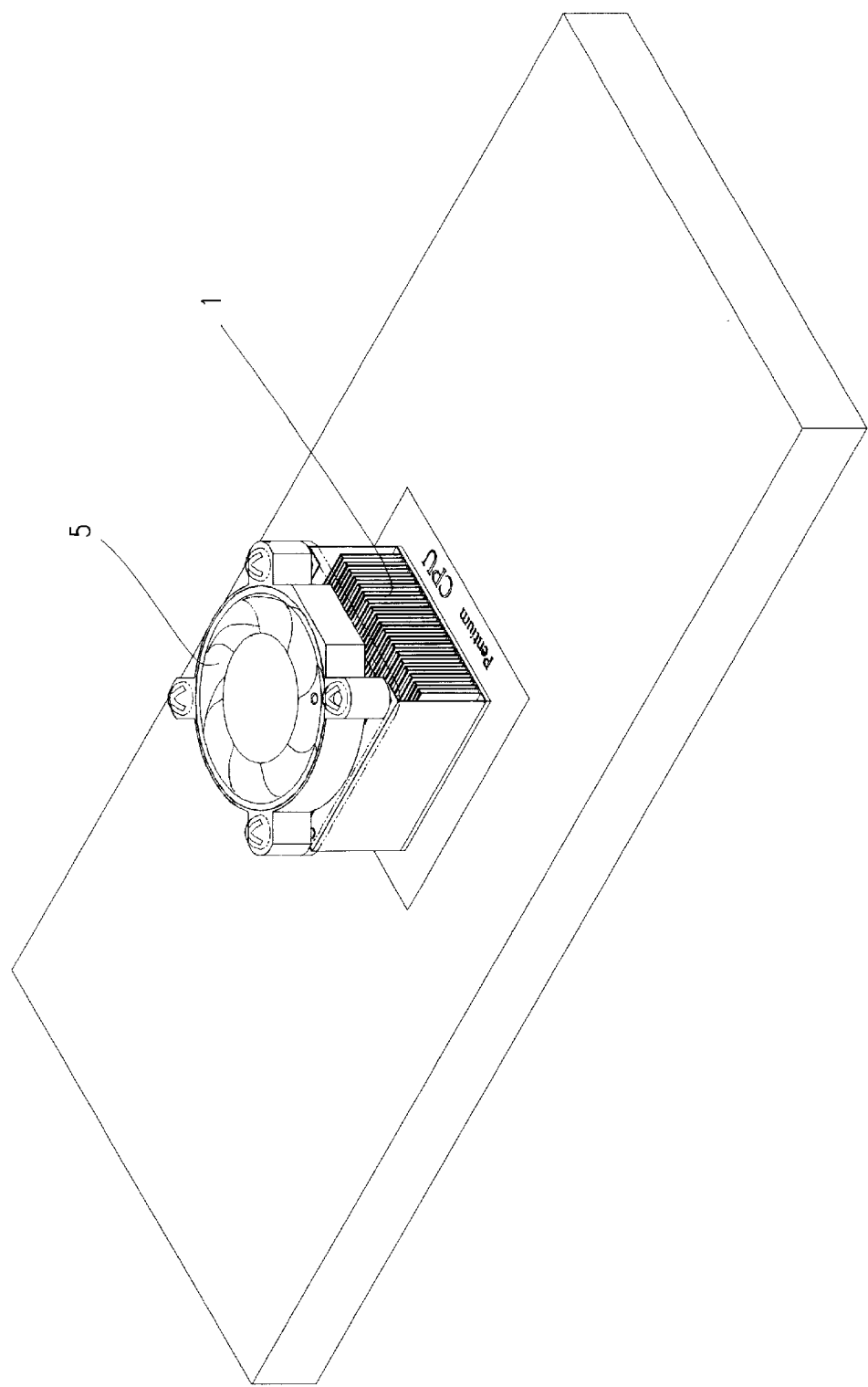
FIG. 1 is an assembled schematic view of the present invention.
Figure 2:
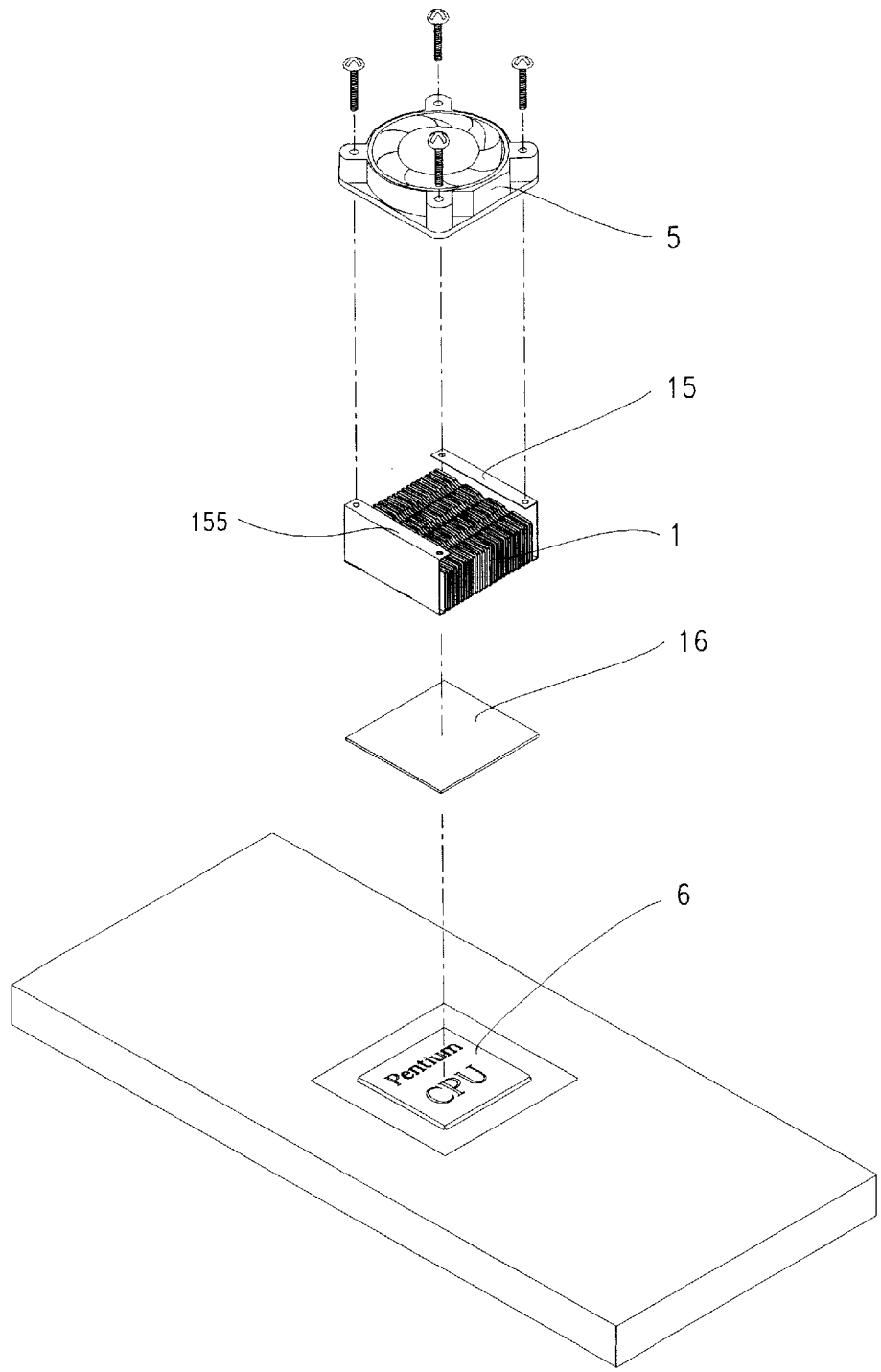
FIG. 2 is a perspective view of the present invention.
Figure 3:
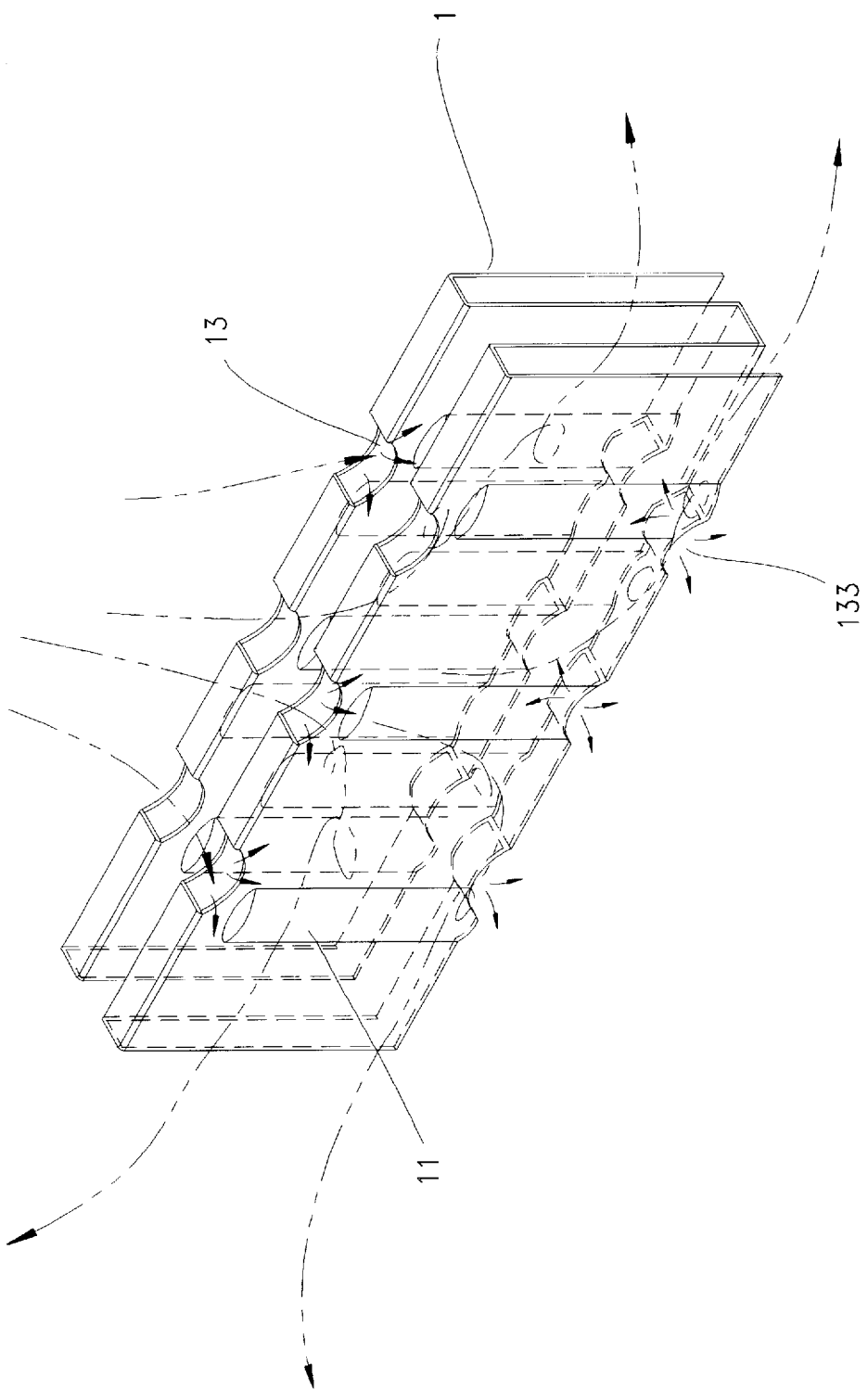
FIG. 3 shows the function of an embodiment for speeding the airflow in the present invention.
Figure 4:
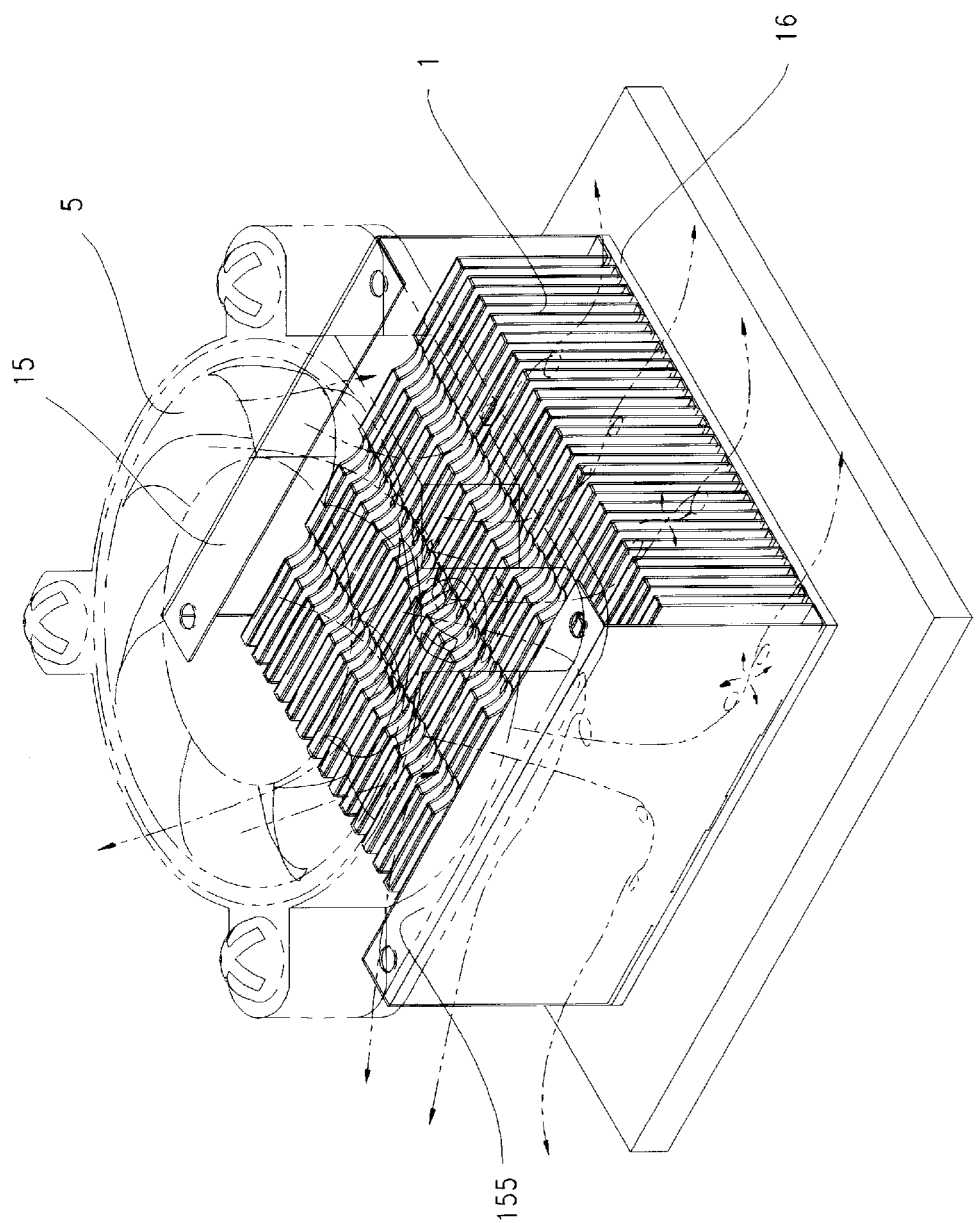
FIG. 4 shows the heat exchange in the present invention.
Figure 5:
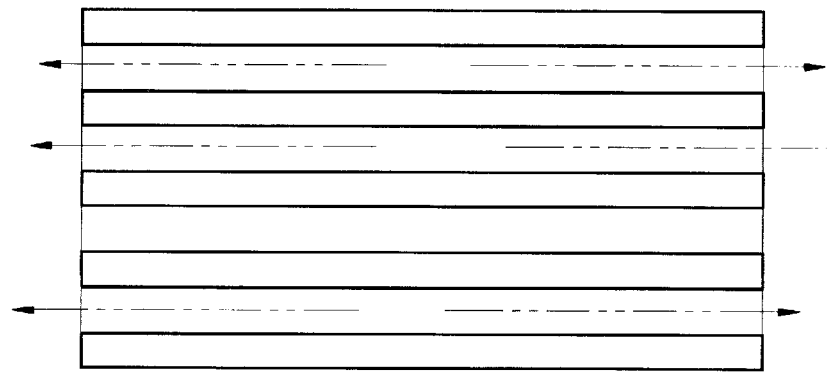
FIG. 5 shows a comparison of heat exchange of the present invention with a prior art design.
Figure 5:
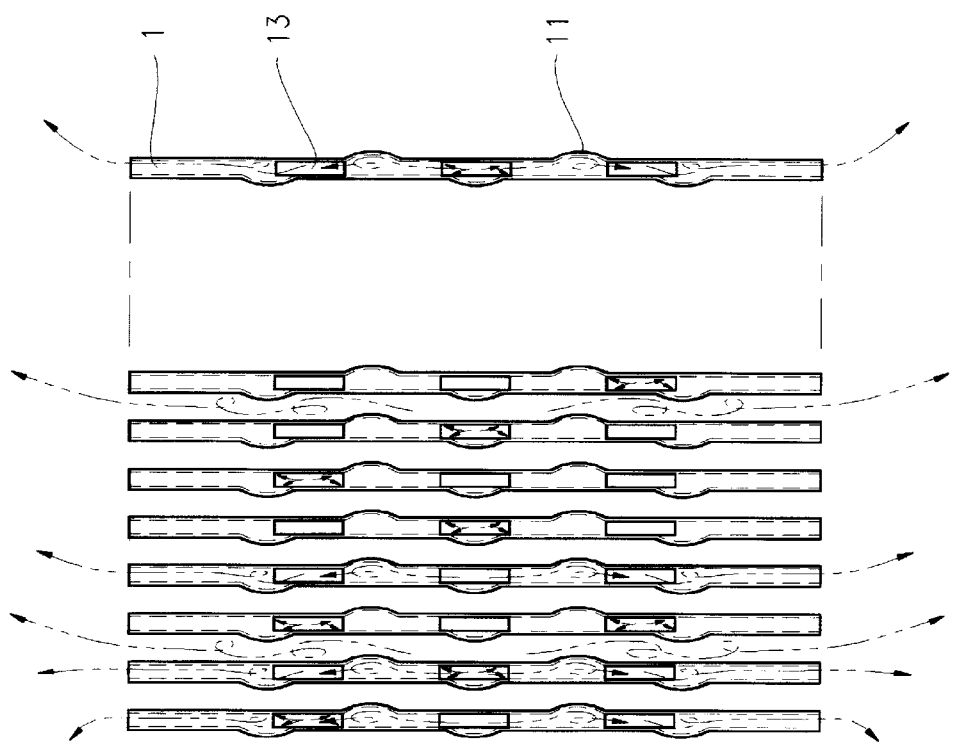

Referring to FIGS. 1 to 5, the CPU heat exchanger of the present invention is illustrated. The CPU heat exchanger of the present invention is mainly constructed by metal thin plates 1, which are integrally formed and is used as a spacer having a continuous curved shape. Each plate is punched with alternative arranged ribs 11 so as to be formed with a rib chamber for airflow. The trench between two surfaces is formed as a curved turbulent flow channel. Each chamber is formed with spaced openings 13, 133 on the lower and topsides of the ribs. Two L shape pieces 15 and 155 serve for locking a fan 5. The lower side of the CPU heat exchanger is connected to a base 16 so that a central processing unit (CPU) can be fixed therein.

In the present invention, the curved shape metal plate 1 has larger area for heat dissipation. When a fan operates and cooling air is extracted. By the guiding of the trench, the airflow is stopped therein, and meanwhile, the openings at the upper end and lower side of the ribs will cause the air to expand transiently so that the heat absorbing is speeded. Therefore, the cooling air can be exchanged sufficiently and therefore, the heat of the CPU can be dissipated rapidly.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

I claim:

1. A CPU heat exchanger comprising:

a plurality of metal thin plates integrally formed into a continuous curved shape, each of said metal thin plates having a plurality of punched ribs, said ribs being alternately arranged on adjacent metal thin plates to form a trench for turbulent flow; and each of said ribs having openings located at an upper side and a lower side thereof.

* * * * *